United States Patent [19]
Alagaratnam et al.

[11] Patent Number: 5,814,881
[45] Date of Patent: Sep. 29, 1998

[54] STACKED INTEGRATED CHIP PACKAGE AND METHOD OF MAKING SAME

[75] Inventors: Maniam Alagaratnam; Qwai H. Low; Chok J. Chia, all of Cupertino, Calif.

[73] Assignee: LSI Logic Corporation, Milpitas, Calif.

[21] Appl. No.: 770,872

[22] Filed: Dec. 20, 1996

[51] Int. Cl.$^6$ ................................................. H01L 23/02
[52] U.S. Cl. ........................ 257/686; 257/676; 257/724; 361/790; 361/820
[58] Field of Search ................................ 257/676, 723, 257/724, 725, 686; 361/790, 820

[56] References Cited

U.S. PATENT DOCUMENTS

| | | | |
|---|---|---|---|
| 5,012,323 | 4/1991 | Farnworth | 257/676 |
| 5,296,737 | 3/1994 | Nishimura et al. | 257/723 |
| 5,331,235 | 7/1994 | Chun | 257/723 |
| 5,347,429 | 9/1994 | Kohno et al. | 257/666 |
| 5,438,224 | 8/1995 | Papageorge et al. | 257/723 |
| 5,463,253 | 10/1995 | Waki et al. | 257/724 |
| 5,471,369 | 11/1995 | Honda et al. | 257/723 |
| 5,479,051 | 12/1995 | Waki et al. | 257/667 |
| 5,523,608 | 6/1996 | Kitaoka et al. | 257/723 |
| 5,545,922 | 8/1996 | Golwalkar et al. | 257/723 |
| 5,640,044 | 6/1997 | Takehashi et al. | 257/666 |

*Primary Examiner*—David Ostrowski
*Attorney, Agent, or Firm*—Oppenheimer Wolff & Donnelly LLP

[57] ABSTRACT

A single leadframe package having stacked integrated chips mounted therein provides multiple electrical functions. The leadframe package construction includes a leadframe die having a substantially smaller outer peripheral dimension than a first integrated circuit chip mounted face down thereon for supporting from below the first integrated chip without obstructing its bond pads. A second integrated circuit is supported from below in a backside to backside configuration by the first integrated circuit without obstructing the bond pads of the second integrated circuit. A plurality of substantially short conductive wires interconnect electrically the first and second integrated circuit chips with selective ones of a plurality of leadframe conductors. An encapsulating material molds the construction into the single leadframe package.

23 Claims, 2 Drawing Sheets

STACKED INTEGRATED CHIP PACKAGE AND METHOD OF MAKING SAME

TECHNICAL FIELD

The present invention relates in general to an integrated chip package and a method of making it. The invention more particularly relates to a single leadframe package having stacked integrated chips mounted therein which can implement different types and kinds of electrical functions, such as digital and analog functions, and which can be manufactured according to a novel fabrication method.

BACKGROUND ART

There have been many different types and kinds of integrated circuits for implementing desired electrical functions. For example, one integrated circuit may be fabricated for processing analog video signals while another integrated circuit may be fabricated for processing digital video signals.

Certain technologies however, may require the implementation of mixed functions to accomplish a desired purpose. Thus, for example a certain technology may require the implementation of both analog and digital signal processing on a single integrated circuit chip.

While the fabrication of multi-purpose functions on a single integrated circuit chip has been achievable in many applications, such fabrication has not always been possible or cost effective. In this regard, it has been difficult, if not impossible, to package chips of different fabrication processes in a single leadframe package. Moreover even when such packaging has been possible, the costs for integrating the different types and kinds of electrical functions in a single integrated chip has been cost prohibitive.

Therefore it would be highly desirable to have a new and improved fabrication process that permits the combination of different types and kinds of integrated circuit chips in a single lead frame package. Such a new and improved single lead frame package should be relatively inexpensive to manufacture.

It is well known to those skilled in the art that a fabrication process that permits the combination of different types and kinds of integrated circuit chips in a single lead frame package is highly desirable. In this regard, such a fabrication technique improves packaging efficiency, leads to cost reductions and helps facilitate improved chip performance.

Because of the benefits that can result from a combination of different types and kinds of integrated circuit chips in a single lead frame package several different attempts have been made to combined different types and kinds of integrated circuit chips in a single lead frame package.

One such attempt to combine multi-function chips in a single lead frame package involved mounting two integrated circuit chips in a side by side configuration on a single lead frame paddle. While such a fabrication process has been possible for some applications, such a process has not always proven to be entirely satisfactory. In this regard, in order to accommodate two integrated chips in such a side by side configuration, the lead frame paddle must be made sufficiently large to accommodate both the integrated chips side by side. Furthermore, by mounting the chips in such a side by side configuration, the resulting abutment makes chip interconnections difficult and very time consuming. Thus fabricating such a side by side chip configuration is only expensive and time consuming but also necessitates chip to chip bonding which is unreliable.

Another attempt at mounting two integrated chips in a single lead frame package has been to piggyback a smaller chip onto the upper face of a lower and larger chip mounted to a single leadframe paddle. Again, while such a fabrication process has been possible for some applications, such a process has not always proven to be entirely satisfactory. In this regard, by utilizing a piggyback technique, the upper chip must be significantly smaller than the lower chip to avoid covering the bond pads of the lower chip.

Another problem associated with the piggyback technique is that bonding of the smaller upper chip to the leadframe results in excessively long interconnecting wires that may result in an electrical short to the lower chip or the wires of the lower chip.

Still yet another attempt at mounting two integrated chips in a single leadframe has been to utilize a flip chip attachment. In this technique a chip can be flip chip attached to another chip, such that one chip is face up on a single leadframe paddle and one chip is face down on the same single leadframe paddle. While such a technique has been possible for certain applications, the process requires special bonding alignment techniques to assure the pads on the lower chip correspond or match the bumps on the upper chip.

Therefore it would be highly desirable to have a new and improved single leadframe package with a multiple chip configuration for implementing multi-functional operations. Such a new and improved leadframe package should not require special alignment or chip to chip bonding techniques, nor should there be excessively long wire leads to cause potential electrical shorts.

DISCLOSURE OF INVENTION

Therefore, the principal object of the present invention is to provide a new and improved single leadframe integrated circuit package has multiple integrated chips and a method of making the integrated circuit package in a relatively inexpensive manner without the use of special alignment or chip to chip bonding techniques.

Briefly, the above and further objects of the present invention are realized by providing a new and improved single leadframe integrated circuit package having multiple integrated chips which can be mounted within the leadframe without special alignment or chip to chip bonding techniques in accordance with a novel fabrication method of the present invention.

The integrated circuit package includes a single leadframe paddle having an overall dimension which is substantially smaller than a lower integrated circuit chip that is mounted thereto in face down manner. The leadframe paddle is sufficiently smaller than the lower integrated circuit chip to allow complete exposure of the peripheral bond pads for ease in making wire to chip bonding connections. An upper integrated circuit chip is mounted face up to the backside of the lower chip in the same manner as in a conventional package.

The stacked chip construction of the present invention facilitates electrical interconnections in a fast and convenient manner utilizing conventional wire bonding techniques as both the lower and the upper integrated circuit chips are in close proximity to one another with their peripheral bond pads completely unobstructed.

The novel method of fabrication includes mounting the lower chip face down to a single leadframe paddle having a smaller peripheral dimension than the lower chip and then mounting the upper chip face up to the backside of the lower chip in the same manner as in a conventional package to facilitate easy of assembly, and ease of wiring without the need of special alignment or chip to chip bonding techniques.

BRIEF DESCRIPTION OF DRAWINGS

The above-mentioned and other objects and features of this invention and the manner of attaining them will become apparent, and the invention itself will be best understood by reference to the following description of an embodiment of the invention taken in conjunction with the accompanying drawings, wherein.

BEST MODE FOR CARRYING OUT THE INVENTION

Figure 1:
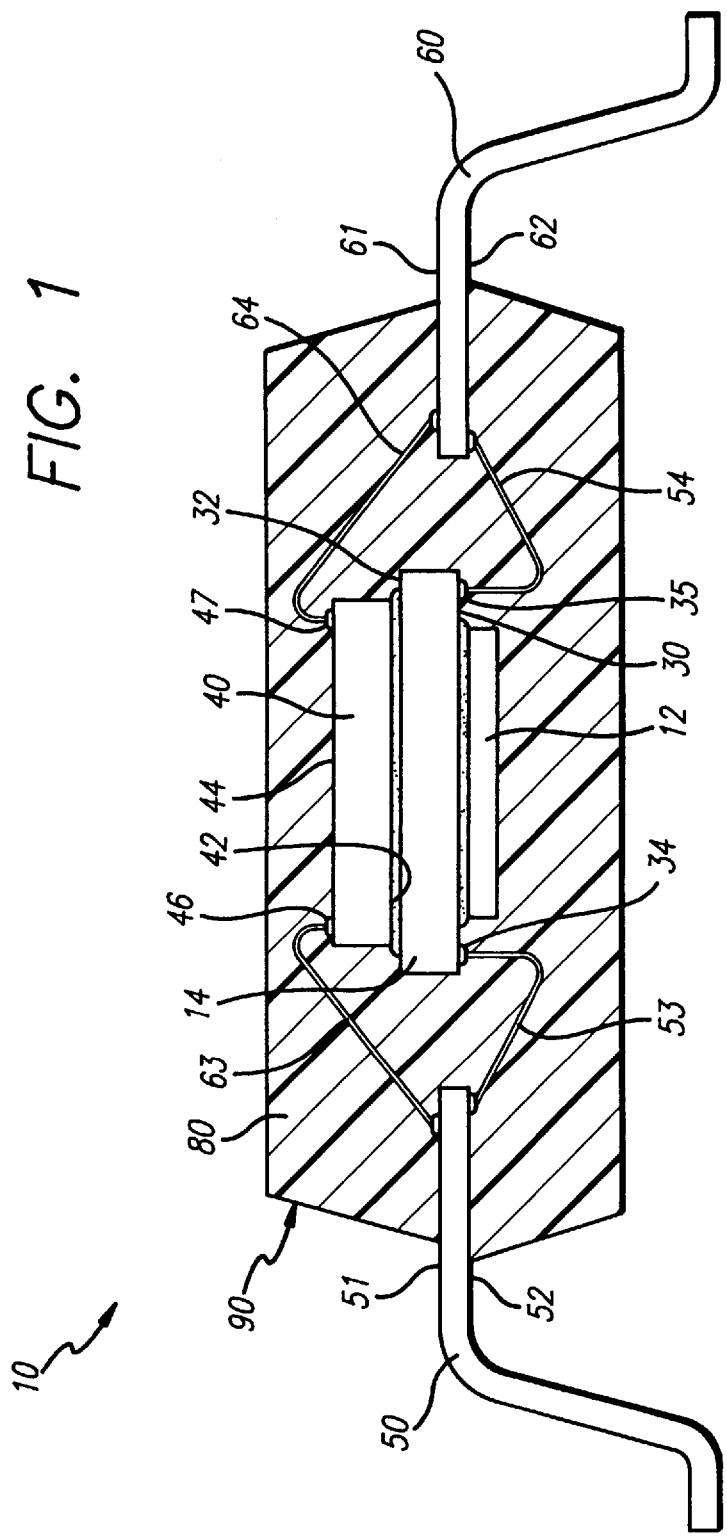
FIG. 1 is a diagrammatic view of a single leadframe integrated circuit package, which is constructed in accordance with the present invention.
Figure 2:
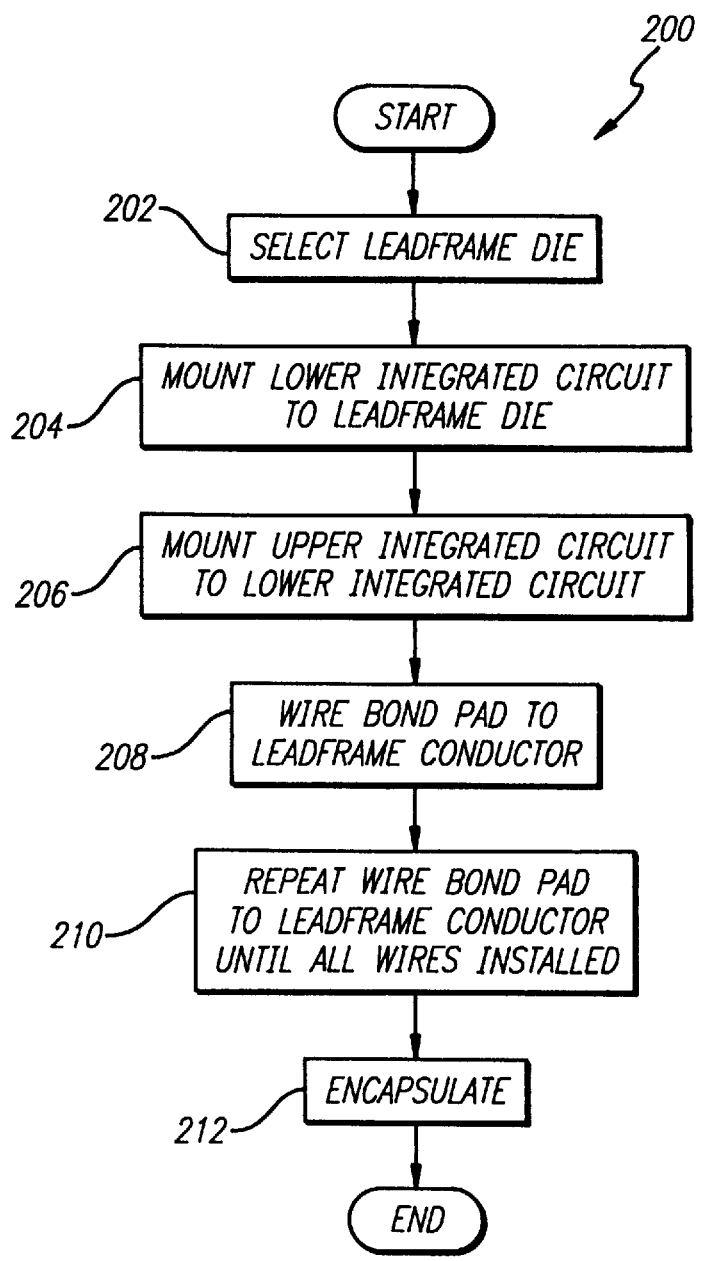
FIG. 2 is a flowchart delineating the fabrication steps performed in accordance with the novel method of the present invention.

Referring now to the drawings, and more particularly to FIG. 1 thereof, there is shown a two chip single leadframe package 10 which is constructed in accordance with the present invention. The two chip leadframe package 10 can be readily manufactured in accordance with the fabrication method of the present invention for implementing multi-functional electrical operations.

The two chip single leadframe package 10 generally comprises a single leadframe paddle or die pad 12 having a predetermined selected peripheral dimension for supporting from below a lower integrated circuit chip 14. The predetermined selected peripheral dimension of the paddle 12 is selected to be substantially smaller than the peripheral dimensions of the lower integrated circuit chip 14.

As best seen in FIG. 1, the integrated circuit 14 includes an obverse or backside surface 32 and a face or front side surface 30 having a plurality of bond pads, such as a bond pad 34 and a bond pad 35 disposed at about its periphery. The front side surface 30 is mounted to the paddle 12, face down in a centrally disposed manner, so that all of the peripheral bond pads of the integrated circuit, such as the bond pads 34 and 35, are unobstructed and completely exposed relative to the paddle 12.

Those skilled in the art will understand that the mounting of the integrated circuit chip 14 to the paddle 12 is effected through conventional mounting techniques and does not necessitate special alignment or chip to paddle bonding techniques.

In order to provide the integrated circuit package 10 with multiple functionality, the leadframe package 10 further includes an upper integrated circuit chip 40. The upper integrated circuit chip 40 includes a backside surface 42 and a front side surface 44 having a plurality of bond pads, such as a bond pad 46 and a bond pad 47. The backside surface 42 of the upper integrated circuit 40 is mounted in a centrally disposed manner to the backside surface 32 of the lower integrated circuit chip 14. In this manner the bond pads 46 and 47 of the upper integrated circuit chip 40 are unobstructed and completely exposed.

The manner of mounting the upper integrated circuit 40 to the lower integrated circuit 14 to permit the lower integrated circuit 14 to support from below the upper integrated circuit 40 is conventional an does not require any special chip to chip bonding technique.

In order to enable the leadframe package 10 to be mounted to a mother board (not shown), the leadframe package 10 further includes a set of conductive leads, such as a conductive lead 50 and a conductive lead 60. The leads 50 and 60 help facilitate establishing electrical paths between the mother board and the integrated circuits 14 and 40 as will be described hereinafter in greater detail. In this regard, the lead 50 has an upper conductive path 51 and a lower conductive path 52, while the lead 60 has another upper conductive path 61 and another lower conductive path 62.

In order to complete the electrical paths between the conductive leads 50 and 60, the leadframe package 10 further includes a set of relatively short rigid wires, such as wires 53 and 54 and 63 and 64 which are bonded to the upper and lower conductive paths 51–52 and 61–62 of leads 50 and 60 respectively. Those skilled in the art will understand that the close proximity of the peripheral bond pads, such as the bond pads 34–35 and 46–47, of the chip 14 relative to the lead conductors 50 and 60, assures that the lead wires, such as the lead wires 53–54 and 63–64, will be sufficiently short to substantially prevent or completely eliminate electrical shorts to respective ones of the chips 14 and 40 and other lead wires not shown.

Those skilled in the art will further understand the mounting of the backside surface 42 of the upper integrated circuit 40 to the backside surface 30 of the lower integrated circuit 14 is accomplished in a conventional manner and thus, enables different types and kinds of integrated circuit chips to be stacked in single leadframe package 10 in a very reliable manner. Thus, like and unlike integrated circuits may be mounted in an abutting relationship, with the only limitation being that the upper integrated circuit 40 may not exceed the peripheral dimensions of the lower integrated circuit chip 14.

In order to provide rigidity to the single leadframe package 10, the stacked chips 14 and 40 and their associated wires and lead conductors are encapsulated in a non-conductive molding compound 80 that defines a body member portion 90 of the leadframe package 10.

Considering now the method of fabricating the single leadframe package 10, the manufacturing process 200 begins at a selecting step 202 wherein the lead frame paddle 12 is selected for supporting from below, the integrated circuit chip 14. In making the selection, the paddle is selected to be sufficiently smaller than the peripheral dimension of the integrated 14, so as not to obstruct any of the bond pads on the chip 14, such as the bond pads 34 and 35.

Next, at a mounting step 204 the integrated circuit 14 is mounted with its face surface 30 face down to the lead frame paddle 12 in a centrally disposed overlying manner on the paddle 12. The integrated circuit 14 is mounted to the frame paddle 12 utilizing conventional chip to die mounting techniques well known to those skilled in the art.

Next, at a mounting step 206, the integrated circuit 40 is mounted with its front side surface 44 face up so that its backside surface 46 is disposed in an abutting relationship with the backside of the integrated circuit 14. The backside to backside mounting of the integrated circuit 14 to the integrated circuit 40 is accomplished utilizing conventional chip to chip mounting techniques well know to those skilled in the art.

In order to complete the electrical paths to the various lead conductors of the leadframe package 10, a connecting step 208 is performed where lead wires composed of a suitable conductive material, such as gold, are connected from individual ones of the bond pads, such as the bond pads 34 and 46, to individual ones of the conductive paths formed on the lead conductors, such as the conductors 50 and 60. Thus for example, lead wire 63 is connected between the bond pad 46 and the upper conductive path 51, while lead wire 53 is connected between the bond pad 34 and the lower conductor path 52. This connecting step is repeated at a repeating step 210 until all of the input and output connections between the integrated circuit chips 14 and 40 have been made relative to all of the lead connectors, such as conductors 50 and 60, and their associated conductive paths 51–52 and 61–62 respectively.

After all interconnections between the chips 14 and 40 and the respective lead conductors have been completed via the lead wires, such as the wires 53–54 and 63–64 respectively, a molding step 212 is performed to encapsulate paddle 12, the chips 14 and 40, the lead wires, such as the lead wires 53–54 and 63–64, and the proximal ends of the lead conductors, such as the lead conductors 50 and 60 with a suitable non-conductive molding material. Thus, the completed fabrication process 200 enables the two chip single lead frame package 10 to be made in a relatively fast, inexpensive and reliable manner utilizing conventional fabrication techniques.

Such a fabrication process 200 permits the combination of different types and kinds of integrated circuit chips in a single lead frame package, improves packaging efficiency, reduces manufacturing costs and helps facilitate improved chip performance. Also a multiple number of chips can be placed on top of a single large base chip, such as chip 12, if the space is available to achieve a multiple die package.

Although a specific embodiment of the present invention has been disclosed, there is no intention limitations to the exact abstract or disclosure herein presented.

We claim:

1. A single leadframe construction, includes a plurality of leadframe conductors and a molded body member for supporting the conductors in substantially fixed positions, comprising:

a leadframe die paddle;

said leadframe die paddle dimensioned to permit the die paddle to be encapsulated entirely within the molded body member and in a spaced apart manner from each individual one of the plurality of leadframe conductors;

an integrated circuit chip disposed in said molded body member includes a backface surface and a frontface surface having plurality of bonds pads disposed at about its periphery;

said integrated circuit chip dimensioned to permit the chip to be encapsulated entirely within the molded body member in a spaced apart manner from each individual one of the plurality of leadframe conductors, said integrated circuit chip dimensioned to enable said integrated chip to be supported from below by said leadframe die paddle in frontface surface abutment without any individual one of said plurality of bond pads being obstructed by said leadframe die paddle;

another integrated circuit chip disposed in said molded body member and having a backside surface and a front side surface with another plurality of bond pads disposed at about its periphery;

said another integrated circuit chip dimensioned to permit the another chip to be encapsulated entirely within the molded body member in a spaced apart manner from each individual one of the plurality of leadframe conductors and dimensioned to be supported from below by said integrated circuit in backside to backface surface abutment so that said another plurality of bond pads are completely unobstructed by said integrated circuit and said leadframe die paddle; and a plurality of lead wires for interconnecting selected ones of the plurality of bonds pads of said integrated circuit and said another integrated circuit with selected ones of the leadframe conductors.

2. A single leadframe construction according to claim 1, wherein said integrated circuit and said another integrated circuit have the same dimensions.

3. A single leadframe construction according to claim 1, wherein said integrated circuit and said another integrated circuit have different dimensions.

4. A single leadframe construction according to claim 3, wherein said integrated circuit has a greater peripheral dimension that said another integrated circuit.

5. A single leadframe construction according to claim 1, wherein said integrated circuit and said another integrated circuit have different electrical functions.

6. A single leadframe construction according to claim 1, wherein said integrated circuit and said another integrated circuit perform the same electrical functions.

7. A two chip leadframe package having a plurality of leadframe conductors, comprising:

a small leadframe die member having a given peripheral dimension;

an integrated circuit chip mounted face down to said die member, said integrated circuit chip having another peripheral dimension greater than said given peripheral dimension to expose a plurality of integrally formed bond pads disposed at about the periphery of said integrated circuit chip;

another integrated circuit chip mounted face up to said integrated circuit chip, said another integrated circuit chip having still yet another peripheral dimension substantially corresponding to said another peripheral dimension; and conductor means for electrically interconnecting selectively the bond pads of said integrated circuit chip and the bond pads of said another integrated circuit chip with individual ones of the plurality of leadframe conductors for implementing multiple electrical functions in a single leadframe package.

8. The leadframe package as in claim 7, wherein said leadframe die member is encapsulated entirely within a molded body member in a spaced apart manner from each individual one of the plurality of leadframe conductors.

9. The leadframe package as in claim 7, wherein said integrated chip is encapsulated entirely within a molded body member in a spaced apart manner from each individual one of the plurality of leadframe conductors.

10. The leadframe package as in claim 7, wherein said another integrated chip is encapsulated entirely within a molded body member in a spaced apart manner from each individual one of the plurality of leadframe conductors, and sufficiently large to be supported from below by said integrated circuit in backside to backface surface abutment so that said another plurality of bond pads are completely unobstructed by said integrated circuit and said leadframe die.

11. The leadframe package as in claim 7, wherein said chip and said another chip have the same dimensions.

12. The leadframe package as in claim 7, wherein said chip and said another chip perform different dimensions.

13. The leadframe package as in claim 7, wherein said chip and said another chip perform different electrical functions.

14. The leadframe package as in claim 7, wherein said chip and said another chip perform the same electrical functions.

15. An integrated circuit chip structure, comprising:

a supporting member;

a first integrated circuit chip mounted to said supporting member, said first chip having a first set of bond pads; and a second integrated circuit chip mounted to said first chip, said second chip having a second set of bond pads;

said first chip comprises a first and second side, with said first side of first chip having said first set of bond pads, wherein said first chip is dimensioned to be supported by said supporting member, and further wherein said supporting member is in abutment with said first side of said first chip without said first set of bond pads being obstructed by said supporting member; and said second chip comprises a first and second side, with said first side of second chip having said second set of bond pads, wherein said second chip is dimensioned to be supported by said first chip, and further wherein said second side of said first chip is in abutment with said second side of said second chip.

16. The integrated circuit chip structure in claim 15, further comprising:

a plurality of leadframe conductors; and a plurality of lead wires electrically interconnecting said leadframe conductors to respective said first and said set of bond pads.

17. The integrated circuit chip structure in claim 16, wherein said supporting member, first integrated chip, second integrated chip, and plurality of said lead wires are encapsulated entirely by a molded body member.

18. The integrated chip structure in claim 17, wherein said first and said second chip have the same dimensions.

19. The integrated chip structure in claim 17, wherein said first and said second chip have different dimensions.

20. The integrated chip structure in claim 17, wherein said first chip is larger than said second chip.

21. The integrated chip structure in claim 17, wherein said first chip and said second chip perform different electrical functions.

22. The integrated chip structure in claim 17, wherein said first chip and said second chip perform the same electrical functions.

23. The integrated chip structure in claim 17, wherein said supporting member is a leadframe die paddle.

* * * * *